(12) United States Patent
Hwang et al.

(10) Patent No.: US 9,478,702 B2
(45) Date of Patent: Oct. 25, 2016

(54) SEMICONDUCTOR LIGHT EMITTING DEVICE

(71) Applicant: SAMSUNG ELECTRONICS CO., LTD., Suwon-Si, Gyeonggi-do (KR)

(72) Inventors: Sung Won Hwang, Hwaseong-si (KR); Je Won Kim, Seoul (KR); Il Ho Ahn, Yongin-si (KR); Soo Jeong Choi, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 1 day.

(21) Appl. No.: 14/513,026

(22) Filed: Oct. 13, 2014

(65) Prior Publication Data

US 2015/0221823 A1 Aug. 6, 2015

(30) Foreign Application Priority Data

Feb. 3, 2014 (KR) ........................ 10-2014-0012243

(51) Int. Cl.
| | | |
|---|---|---|
| *H01L 33/08* | (2010.01) | |
| *F21V 8/00* | (2006.01) | |
| *F21V 19/00* | (2006.01) | |
| *F21K 99/00* | (2016.01) | |
| *F21Y 101/02* | (2006.01) | |
| *F21S 8/10* | (2006.01) | |
| *H01L 33/00* | (2010.01) | |
| *H01L 33/24* | (2010.01) | |
| *H01L 33/16* | (2010.01) | |

(52) U.S. Cl.
CPC .............. *H01L 33/08* (2013.01); *F21K 9/135* (2013.01); *F21V 19/001* (2013.01); *G02B 6/0073* (2013.01); *F21S 48/1159* (2013.01); *F21S 48/328* (2013.01); *F21Y 2101/02* (2013.01); *H01L 33/007* (2013.01); *H01L 33/16* (2013.01); *H01L 33/24* (2013.01)

(58) Field of Classification Search
CPC ....... H01L 33/06; H01L 33/08; H01L 33/32; H01L 33/007; H01L 33/16; H01L 33/24; H01L 33/33; G02B 6/0073; F21V 19/001; F21V 19/02; F21K 9/135; F21Y 2101/02; F21S 48/1159; F21S 48/328
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| 6,682,991 | B1 * | 1/2004 | Hino ................... H01L 21/0332 257/E21.035 |
| RE38,466 | E | 3/2004 | Inoue et al. |
| 6,818,465 | B2 * | 11/2004 | Biwa ....................... H01L 33/24 257/190 |

(Continued)

FOREIGN PATENT DOCUMENTS

| | | |
|---|---|---|
| JP | 4586935 B2 | 11/2010 |
| JP | 5097532 B2 | 12/2012 |

(Continued)

*Primary Examiner* — Dale E Page
*Assistant Examiner* — Quovaunda V Jefferson
(74) *Attorney, Agent, or Firm* — Lee & Morse, P.C.

(57) ABSTRACT

There is provided a semiconductor light emitting device including: a first conductivity-type semiconductor base layer; a mask layer disposed on the first conductivity-type semiconductor base layer and including a graphene layer with a plurality of openings exposing the first conductivity-type semiconductor base layer; and a plurality of light emitting nanostructures disposed on the openings and each including a first conductivity-type semiconductor core, an active layer, and a second conductivity-type semiconductor layer.

18 Claims, 13 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,968,359 B2 | 6/2011 | Hersee |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,030,108 B1 * | 10/2011 | Lee ............... B82Y 10/00 257/E21.09 |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2011/0003453 A1 * | 1/2011 | Jang ............... B82Y 30/00 438/381 |
| 2011/0188263 A1 * | 8/2011 | Cho ............... F21V 7/22 362/606 |
| 2011/0309382 A1 | 12/2011 | Lowgren |
| 2012/0161100 A1 | 6/2012 | Hsu |
| 2012/0235117 A1 | 9/2012 | Fukui et al. |
| 2013/0112944 A1 | 5/2013 | Cha et al. |
| 2013/0187128 A1 | 7/2013 | Yi et al. |

FOREIGN PATENT DOCUMENTS

| | | |
|---|---|---|
| KR | 10-2012-0083084 A | 7/2012 |
| KR | 10-1258582 B1 | 4/2013 |
| KR | 10-2013-0071142 A | 6/2013 |
| KR | 10-1269053 B1 | 6/2013 |

* cited by examiner

SEMICONDUCTOR LIGHT EMITTING DEVICE

CROSS-REFERENCE TO RELATED APPLICATION

This application claims the benefit of Korean Patent Application No. 10-2014-0012243 filed on Feb. 3, 2014, with the Korean Intellectual Property Office, the disclosure of which is incorporated herein by reference.

BACKGROUND

The present disclosure relates to a semiconductor light emitting device.

Light Emitting Diodes (LEDs) have many advantages such as relatively long lifespans, low degrees of power consumption, rapid response speeds, environmental friendliness, and the like, compared to related art light sources. To this end, LEDs have been widely seen as next generation lighting sources, and have come to prominence as an important type of light source for use in various products, such as general lighting devices and in the backlights of display devices. In particular, LEDs based on Group III nitrides, such as GaN, AlGaN, InGaN, InAlGaN, and the like, commonly serve as semiconductor light emitting devices outputting blue or ultraviolet light.

Recently, as LEDs have come into widespread use, the utilization thereof has extended to light sources of devices for use in high current and high output applications. Demand for LEDs for use in high current and high output applications has spurred ongoing research into improvements in light emitting characteristics in the art. In particular, in order to increase luminous efficiency through enhancements in crystallinity and increases in light emitting areas, semiconductor light emitting devices having light emitting nanostructures and manufacturing techniques therefor have been proposed.

SUMMARY

An aspect of the present disclosure may provide a semiconductor light emitting device having a reduced leakage current and an enhanced light output.

According to an aspect of the present disclosure, a semiconductor light emitting device may include: a first conductivity-type semiconductor base layer; a mask layer disposed on the first conductivity-type semiconductor base layer and including a graphene layer with a plurality of openings exposing the first conductivity-type semiconductor base layer; and a plurality of light emitting nanostructures disposed on the openings and each including a first conductivity-type semiconductor core, an active layer, and a second conductivity-type semiconductor layer.

The mask layer may include the graphene layer and at least one insulating layer disposed above or below the graphene layer.

The at least a portion of the at least one insulating layer may be crystalline.

The mask layer may include first, second, and third layers sequentially stacked on the first conductivity-type semiconductor base layer, and the second layer may be the graphene layer, and each of the first and third layers may be oxide layer or nitride layer.

The oxide layer may include at least one of $SiO_2$, $Al_2O_3$, $ZrO$, and $TiO_2$, and the nitride layer may include at least one of SiN, SiON, TiN, TiAlN, TiSiN, and AlN.

The mask layer may include a first nitride layer, a first graphene layer, an oxide layer, a second graphene layer, and a second nitride layer sequentially stacked on the first conductivity-type semiconductor base layer.

A thickness of the oxide layer may be greater than thicknesses of the first and second nitride layers.

The graphene layer may include graphene in the form of a quantum dot.

The graphene layer may be a monolayer graphene or a multilayer graphene.

The graphene layer may include graphene of which at least a portion is oxidized.

A thickness of the mask layer may range from 160 nm to 240 nm.

The plurality of light emitting nanostructures may further include a high resistive layer disposed to be in contact with the active layer.

The semiconductor light emitting device may further include a transparent electrode layer positioned on the second conductivity-type semiconductor layer.

According to another aspect of the present disclosure, a semiconductor light emitting device may include: a first conductivity-type semiconductor base layer; a mask layer disposed on the first conductivity-type semiconductor base layer and including two or more layers formed of different materials with a plurality of openings exposing the first conductivity-type semiconductor base layer; and a plurality of light emitting nanostructures disposed on the openings and each including a first conductivity-type semiconductor core, an active layer, and a second conductivity-type semiconductor layer.

The mask layer may include at least one graphene layer.

According to another aspect of the present disclosure, a backlight unit may include: a substrate; a light source mounted on the substrate; and an optical sheet disposed above the light source, wherein the light source includes the light emitting device.

According to another aspect of the present disclosure, a semiconductor light emitting device may include: a first conductivity-type semiconductor base layer; a mask layer disposed on the first conductivity-type semiconductor base layer and including a stress alleviating layer with an opening exposing the first conductivity-type semiconductor base layer; and a light emitting nanostructure disposed on the opening and including a first conductivity-type semiconductor core, a high resistive layer, an active layer, and a second conductivity-type semiconductor layer.

The high resistive layer may be deposed between the first conductivity-type semiconductor core and the active layer.

The high resistive layer may be deposed on the active layer.

The high resistive layer may be configured to block leakage current generated in an upper portion of the first conductivity-type semiconductor core.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
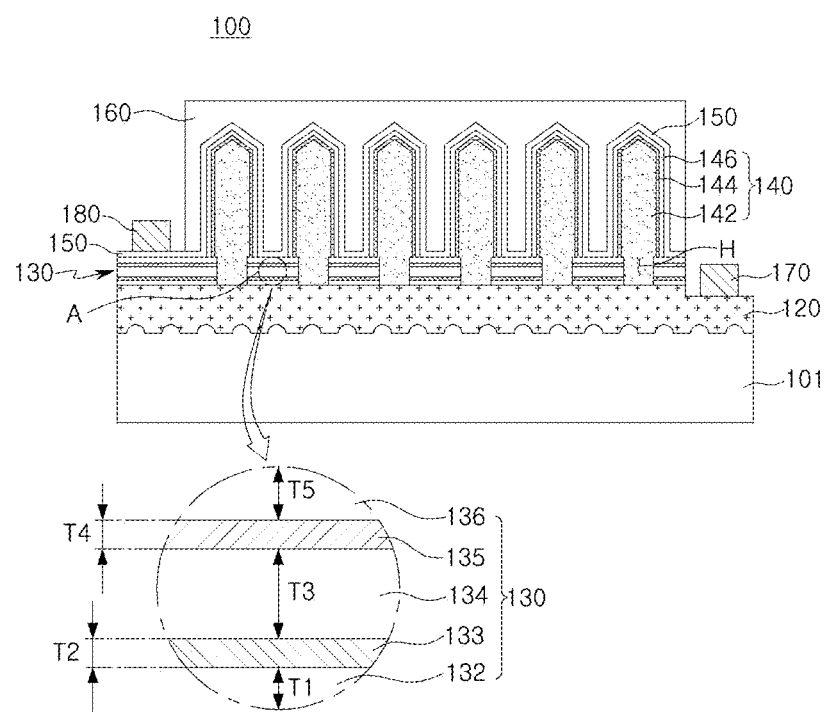
FIG. 1 is a cross-sectional view schematically illustrating a semiconductor light emitting device according to an exemplary implementation of the present disclosure.

Hereinafter, exemplary implementations of the present disclosure will be described in detail with reference to the accompanying drawings.

The disclosure may, however, be exemplified in many different forms and should not be construed as being limited to the specific implementations set forth herein. Rather, these implementations are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view schematically illustrating a semiconductor light emitting device according to an exemplary implementation of the present disclosure.

Referring to FIG. 1, a semiconductor light emitting device 100 includes a substrate 101, and a first conductivity-type semiconductor base layer 120, a mask layer 130, light emitting nanostructures 140, a transparent electrode layer 150, and a filler layer 160 formed on the substrate 101. Each light emitting nanostructure 140 includes a first conductivity-type semiconductor core 142, an active layer 144, and a second conductivity-type semiconductor layer 146 grown on the first conductivity-type semiconductor base layer 120.

The semiconductor light emitting device 100 may further include first and second electrodes 170 and 180 electrically connected to the first conductivity-type semiconductor base layer 120 and the second conductivity-type semiconductor layer 146, respectively.

In the present disclosure, unless otherwise mentioned, directionality in terms such as 'upper portion', 'upper surface', 'lower portion', 'lower surface', 'lateral surface', and the like, is determined based on the drawings, and in actuality, the terms may be changed according to a direction in which a device is disposed.

The substrate 101 may be provided as a semiconductor growth substrate and may be formed of an insulating, a conductive, or a semiconductive material such as sapphire, SiC, $MgAl_2O_4$, MgO, $LiAlO_2$, $LiGaO_2$, GaN, or the like. A sapphire substrate is a crystal having Hexa-Rhombo R3c symmetry, of which lattice constants in c-axial and a-axial directions are approximately 13.001Å and 4.758 Å, respectively, and has a C-plane (0001), an A-plane (11-20), an R-plane (1-102), and the like. In this case, the C-plane of sapphire crystal allows a nitride thin film to be relatively easily grown thereon and is stable at high temperatures, so the sapphire substrate is commonly used as a nitride growth substrate. Meanwhile, in a case in which the substrate 101 is formed of silicon (Si), it may be more appropriate for increasing a diameter and is relatively low in price, facilitating mass-production.

A depression and protrusion pattern may be formed on a surface of the substrate 101 to enhance light extraction efficiency. However, a shape of the depression and protrusion pattern is not limited to that illustrated in the drawing. According to another exemplary implementation, a buffer layer may be further disposed on the substrate 101 in order to enhance crystallinity of the first conductivity-type semiconductor base layer 120. The buffer layer may be formed of, for example, $Al_xGa_{1-x}N$ grown at a low temperature without being doped.

The substrate 101 may be removed to be omitted according to another exemplary implementation. For example, in a case in which the semiconductor light emitting device 100 is mounted on an external device such as a package board in a flipchip manner, the substrate 101 may be omitted, and even when silicon (Si) is used as a material of the substrate 101, the substrate 101 may be omitted.

The first conductivity-type semiconductor base layer 120 may be disposed on the substrate 101. The first conductivity-type semiconductor base layer 120 may be formed of a Group III-V compound, for example, GaN. The first conductivity-type semiconductor base layer 120 may be, for example, n-GaN doped with an n-type impurity.

In the present exemplary implementation, the first conductivity-type semiconductor base layer 120 may be commonly connected to one sides of the respective light emitting nanostructures 140 to serve as a contact electrode, as well as providing crystal planes for growing the first conductivity-type semiconductor core 142.

The mask layer 130 is disposed on the first conductivity-type semiconductor base layer 120. The mask layer 130 may include graphene and configured as two or more layers formed of different materials. The mask layer 130 may include a plurality of openings H exposing portions of the first conductivity-type semiconductor base layer 120. The diameter, length, position, and growth conditions of the light emitting nanostructures 140 may be determined according to the size of the plurality of openings H. The plurality of openings H may have various shapes such as a circular shape, quadrangular shape, hexagonal shape, and the like.

In the present exemplary implementation, the mask layer 130 may include first to fifth layers 132 to 136 sequentially stacked on the first conductivity-type semiconductor base layer 120. The second and fourth layers 133 and 135 may be graphene layers, and the first, third, and fifth layers 132, 134, and 136 may be an oxide layer or a nitride layer. For example, the first and fifth layer 132 and 136 may be nitride layers, and the third layer 134 may be an oxide layer. Also, among the first, third, and fifth layer 132, 134, and 316, the first and fifth layers 132 and 136 disposed in the lowermost portion and the uppermost portion may be insulating layers.

The graphene layer may be configured as a graphene monolayer or graphene multiple layers. Graphene refers to a two-dimensional (2D) thin film having a honeycomb structure formed of a layer of carbon atoms and has a structure of a 2D carbon hexagonal plane formed as carbon atoms are chemically bonded by an $sp^2$ hybrid orbital. A thickness of a graphene monolayer is merely equivalent to a size of one carbon atom, approximately 0.34 nm. Graphene has excellent heat conductivity quality, thermal stability, and high elasticity. In detail, graphene may stably retain its properties even at high temperatures of 1000° C. or higher, and since graphene is stretchable, graphene may be applied to various electronic devices. The nitride layer may include at least one of SiN, SiON, TiN, TiAlN, TiSiN, and AlN. The oxide layer may include at least one of $SiO_2$, $Al_2O_3$, ZrO, and $TiO_2$.

The first to fifth layers 132 to 136 may have first to fifth thicknesses T1 to T5 in sequence, respectively. In a case in which the first and fifth layers 132 and 136 are nitride layer and the third layer 134 is an oxide layer, the first and fifth thicknesses T1 and T5 may be smaller than the third thickness T3. Also, the second and fourth thicknesses T2 and T4 of the second and fourth layers 133 and 135, graphene layers, may be substantially equal or similar to each other. However, relative thicknesses of the first to fifth layers 132 to 136 are not limited thereto and may be variously modified. The mask layer 130 may have a total thickness ranging from approximately 160 nm to 240 nm, and the total thickness may be varied depending on a size, or the like, of the first conductivity-type semiconductor core 142.

In the present exemplary implementation, the mask layer including the second and fourth layers 133 and 135 as graphene layers having high elasticity may serve as a buffer alleviating stress acting on the first, third, and fifth layers 132, 134, and 136 during a growth process of the light emitting nanostructures 140. Also, even when at least a portion of the first, third, and fifth layers 132, 134, and 136 is crystallized during a follow-up high temperature process, since the second and fourth layers 133 and 135, graphene layers, are insertedly positioned to form heterointerfaces, formation of a leakage path through a grain boundary may be prevented. Thus, although currents are concentrated on a lower portion of the light emitting nanostructures 140, a leakage current may be effectively blocked in the vicinity of the mask layer 130.

The plurality of light emitting nanostructures 140 may be disposed in positions corresponding to the plurality of openings H. The light emitting nanostructures 140 may have a core-shell structure including the first conductivity-type semiconductor core 142 grown on regions of the first conductivity-type semiconductor base layer 120 exposed by the plurality of openings H, the active layer 144 sequentially formed on a surface of the first conductivity-type semiconductor core 142, and the second conductivity-type semiconductor layer 146.

The first conductivity-type semiconductor core 142 and the second conductivity-type semiconductor layer 146 may respectively be formed of semiconductor doped with an n-type impurity and a p-type impurity, but the present disclosure is not limited thereto and, conversely, the first conductivity-type semiconductor core 142 and the second conductivity-type semiconductor layer 146 may respectively be formed of p-type and n-type semiconductor. The first conductivity-type semiconductor core 142 and the second conductivity-type semiconductor layer 146 may be formed of a nitride semiconductor, e.g., a material having a composition of $Al_xIn_yGa_{1-x}N$ (0≤x≤1, 0≤y≤1, 0≤x+y≤1). Each of the semiconductor layers 142 and 146 may be configured as a single layer, or may include a plurality of layers having different characteristics such as different doping concentrations, compositions, and the like. Here, the first conductivity-type semiconductor core 142 and the second conductivity-type semiconductor layer 146 may be formed of an AlInGaP or AlInGaAs semiconductor, besides a nitride semiconductor. In the present exemplary implementation, the first conductivity-type semiconductor core 142 may be formed of n-GaN doped with silicon (Si) or carbon (C), and the second conductivity-type semiconductor layer 146 may be formed of p-GaN doped with magnesium (Mg) or zinc (Zn).

As illustrated, the width of the first conductivity-type semiconductor core 142 may be greater than those of the openings H of the mask layer 130, but the present disclosure is not limited thereto.

The active layer 144 may be disposed on a surface of the first conductivity-type semiconductor core 142. The active layer 144 may be a layer emitting light having a predetermined level of energy according to electron-hole recombination and formed of a single material such as InGaN, or the like, or may have a multi-quantum well (MQW) structure in which quantum barrier layers and quantum well layers are alternately disposed, and, for example, in case of a nitride semiconductor, an GaN/InGaN structure may be used. In the case in which the active layer 144 includes InGaN, since the content of indium (In) is increased, crystal defects due to lattice mismatches may be reduced and internal quantum efficiency of the semiconductor light emitting device 100 may be increased. Also, an emission wavelength may be adjusted according to the content of indium (In).

The number of light emitting nanostructures 140 included in the semiconductor light emitting device 100 may not be limited to that illustrated in the drawings and the semiconductor light emitting device 100 may include, for example, tens to millions of light emitting nanostructures 140. The light emitting nanostructures 140 according to the present disclosure may include a lower hexagonal prism region and an upper hexagonal pyramid region. In this case, the first conductivity-type semiconductor core 142 may have lower m planes and upper r planes, different crystal planes, and thicknesses of the active layer 144 and the second conductivity-type semiconductor layer 146 formed in the upper portions thereof may be different according to the crystal planes. For example, thicknesses of the active layer 144 and the second conductivity-type semiconductor layer 146 on the m planes may be greater than those of the active layer 144 and the second conductivity-type semiconductor layer 146 on the r planes.

Also, according to an exemplary implementation, the light emitting nanostructures 140 may have a pyramid shape or a pillar shape. Since the light emitting nanostructures 104 have a three-dimensional shape, a light emitting surface area is relatively large, increasing luminous efficiency.

The transparent electrode layer 150 is electrically connected to the second conductivity-type semiconductor layer 146. The transparent electrode layer 150 may cover upper surfaces and lateral surfaces of the light emitting nanostructure 140 and may be connected between adjacent light emitting nanostructures 140. The transparent electrode layer 150 may be formed of, for example, indium tin oxide (ITO), aluminum zinc oxide (AZO), indium zinc oxide (IZO), ZnO, GZO (ZnO:Ga), $In_2O_3$, $SnO_2$, CdO, $CdSnO_4$, or $Ga_2O_3$.

The filler layer 160 may be disposed on the light emitting nanostructures 140 and the transparent electrode layer 150. The filler layer 160 may fill spaces between adjacent light emitting nanostructures 140 and may be disposed to cover the light emitting nanostructures 140 and the transparent electrode layer 150 on the light emitting nanostructures 140. According to another exemplary implementation, an upper surface of the filler layer 160 may be formed to be uneven along the light emitting nanostructures 140.

The filler layer 160 may be formed of a light-transmissive insulating material and include, for example, $SiO_2$, $SiN_x$, $Al_2O_3$, HfO, $TiO_2$, or ZrO. However, according to another exemplary implementation, the filler layer 160 may include a conductive material. In this case, the filler layer 160 may be formed to be electrically connected to the second electrode 180 or may be integrally formed with the second electrode 180. The semiconductor light emitting device 100 may be mounted in a flipchip structure such that the first and second electrodes 170 and 180 face an external board such as a package board.

According to another exemplary implementation, a passivation layer may be disposed on the filler layer 160. The passivation layer may be disposed to expose only upper surfaces of the first and second electrodes 170 and 180.

The first and second electrodes 170 and 180 may be disposed on the first conductivity-type semiconductor layer 120 and the transparent electrode layer 150 on one side of the semiconductor light emitting device 100 such that the first and second electrodes 170 and 180 are electrically connected to the first conductivity-type semiconductor layer 120 and the second conductivity-type semiconductor 146, respectively.

However, dispositions and shapes of the first and second electrodes 170 and 180 are merely illustrative and may be variously modified. According to an exemplary implementation of the present disclosure, in a case that the substrate 101 is formed of a conductive material, the first electrode 170 may be disposed below the substrate 101 or may be omitted.

The first and second electrodes 170 and 180 may be formed as a monolayer or may have a multilayer structure of a conductive material. For example, the first and second electrodes 170 and 180 may include one or more of Au, Ag, Cu, Zn, Al, In, Ti, Si, Ge, Sn, Mg, Ta, Cr, W, Ru, Rh, Ir, Ni, Pd, Pt, and an alloy thereof.

Figure 2A:
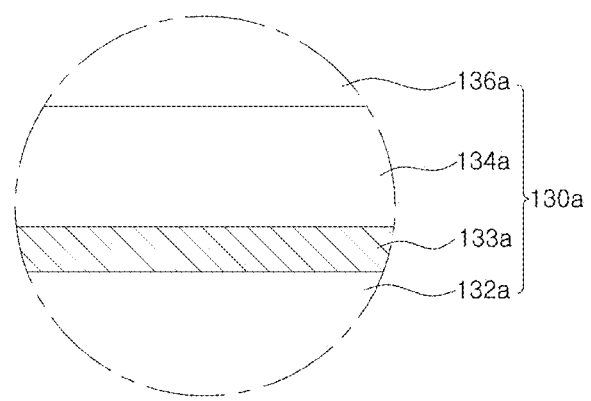
FIGS. 2A and 2B are cross-sectional views schematically illustrating mask layers employable in a semiconductor light emitting device according to an exemplary implementation of the present disclosure.
Figure 2B:
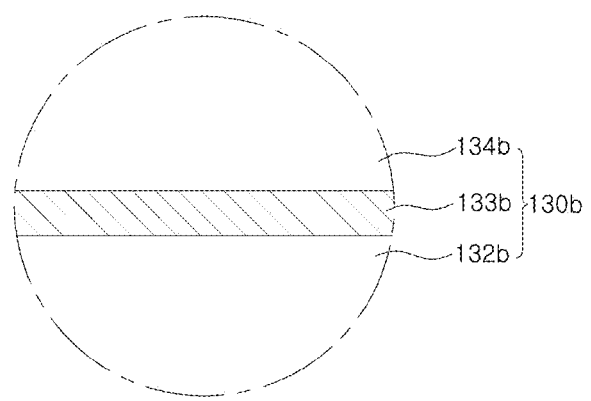

FIGS. 2A and 2B are cross-sectional views schematically illustrating mask layers employable in a semiconductor light emitting device according to an exemplary implementation of the present disclosure. In FIGS. 2A and 2B, cross-sections of regions corresponding to the region A of FIG. 1 are illustrated.

Referring to FIG. 2A, a mask layer 130a may include first to fourth layers 132a, 133a, 134a, and 136a sequentially stacked on the first conductivity-type semiconductor base layer 120. The second layer 133a may be a graphene layer, and the first, third, and fourth layers 132a, 134a, and 136a may be an oxide layer or a nitride layer. Also, the first and fourth layers 132a and 136a may be insulating layers. For example, the first and fourth layers 132a and 136a may be nitride layers, and the third layer 134a may be an oxide layer.

As in the present exemplary implementation, different amounts of oxide layers or nitride layers may be disposed above and below the second layer 133a, the graphene layer.

Referring to FIG. 2B, a mask layer 130b may include first to third layers 132b, 133b, and 134b sequentially stacked on the first conductivity-type semiconductor base layer 120. The second layer 133b may be a graphene layer, and the first and third layers 132b and 134b may be an oxide layer and a nitride layer, respectively. Also, the first and third layers 132b and 134b may be insulating layers.

Figure 3:
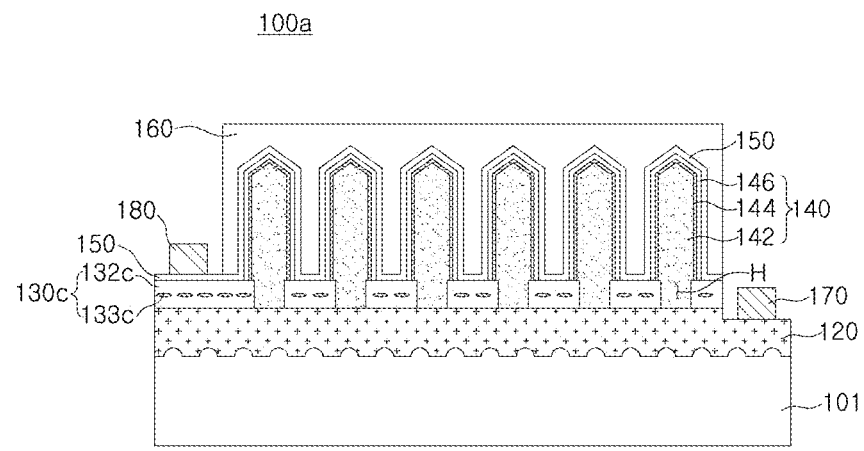
FIG. 3 is a cross-sectional view schematically illustrating a semiconductor light emitting device according to another exemplary implementation of the present disclosure.

FIG. 3 is a cross-sectional view schematically illustrating a semiconductor light emitting device according to another exemplary implementation of the present disclosure.

In the following drawings, reference numerals identical to those of FIG. 1 denote the same components, so redundant descriptions will be omitted.

Referring to FIG. 3, a semiconductor light emitting device 100a includes a substrate 101, and a first conductivity-type semiconductor base layer 120, a mask layer 130c, light emitting nanostructures 140, a transparent electrode layer 150, and a filler layer 160 formed on the substrate 101. Each light emitting nanostructure 140 includes a first conductivity-type semiconductor core 142, an active layer 144, and a second conductivity-type semiconductor layer 146 grown on the first conductivity-type semiconductor base layer 120. The semiconductor light emitting device 100a may further include first and second electrodes 170 and 180 electrically connected to the first conductivity-type semiconductor base layer 120 and the second conductivity-type semiconductor layer 146, respectively.

In the present exemplary implementation, the mask layer 130c may include first and second layers 132c and 133c, and the second layer 133c may be disposed to be embedded within the first layer 132c. For example, the first layer 132c may be an insulating layer, and the second layer 133c may be graphene in the form of a quantum dot. According to an exemplary implementation, the second layer 133c may include 2D graphene layers spaced apart from one another or may include 3D graphene structures spaced apart from one another.

Figure 4:
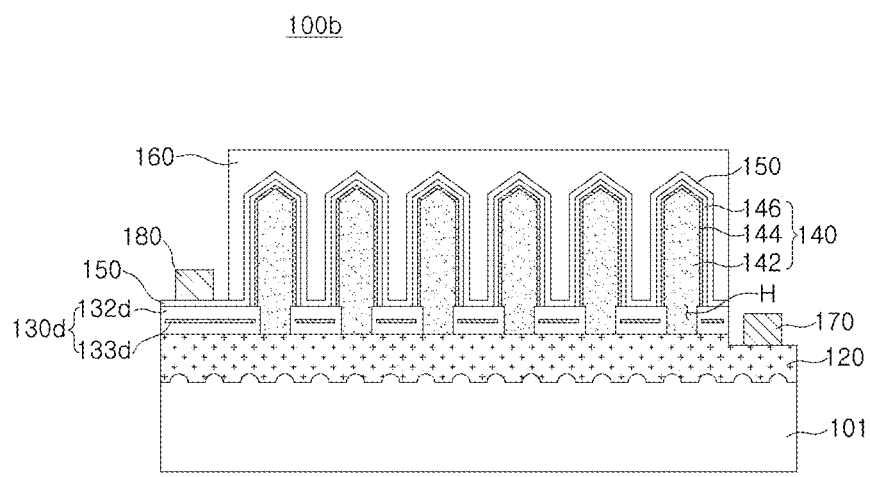
FIG. 4 is a cross-sectional view schematically illustrating a semiconductor light emitting device according to another exemplary implementation of the present disclosure.

FIG. 4 is a cross-sectional view schematically illustrating a semiconductor light emitting device according to another exemplary implementation of the present disclosure.

Referring to FIG. 4, a semiconductor light emitting device 100b includes a substrate 101, and a first conductivity-type semiconductor base layer 120, a mask layer 130d, light emitting nanostructures 140, a transparent electrode layer 150, and a filler layer 160 formed on the substrate 101. Each light emitting nanostructure 140 includes a first conductivity-type semiconductor core 142, an active layer 144, and a second conductivity-type semiconductor layer 146 grown on the first conductivity-type semiconductor base layer 120. The semiconductor light emitting device 100b may further include first and second electrodes 170 and 180 electrically connected to the first conductivity-type semiconductor base layer 120 and the second conductivity-type semiconductor layer 146, respectively.

In the present exemplary implementation, the mask layer 130d may include first and second layers 132d and 133d, and the second layer 133d may be disposed to be encompassed by the first layer 132d. For example, the first layer 132d may be an insulating layer, and the second layer 133d may be a graphene layer. Regions of the second layer 133d adjacent to the openings H may be may be covered by the first layer 132d and not exposed to the sides of the mask layer 130d through the openings H.

FIGS. 5A through 5F are cross-sectional views schematically illustrating a method of manufacturing a semiconductor light emitting device according to an exemplary implementation of the present disclosure. In FIGS. 5A through 5F, the method of manufacturing a semiconductor light emitting device will be described based on the semiconductor light emitting device of FIG. 1, but semiconductor light emitting devices of any other exemplary implementations may also be manufactured in a similar manner.

Figure 5A:
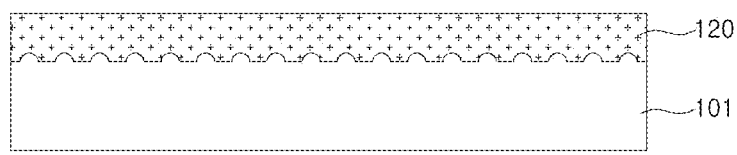
FIGS. 5A through 5F are cross-sectional views schematically illustrating a method of manufacturing a semiconductor light emitting device according to an exemplary implementation of the present disclosure.

Referring to FIG. 5A, a depression and protrusion pattern may be formed on an upper surface of the substrate 101 and a first conductivity-type semiconductor may be grown on the substrate 101 to form a first conductivity-type semiconductor base layer 120.

The first conductivity-type semiconductor base layer 120 may provide a crystal growth surface allowing the light emitting nanostructures 140 (refer to FIG. 1) to grow thereon, and may be a structure electrically connecting to one side of the light emitting nanostructures 140. Thus, the first conductivity-type semiconductor base layer 120 may be formed as a semiconductor single crystal having electrical conductivity, and in this case, the substrate 101 may be a substrate for crystal growth.

Figure 5B:
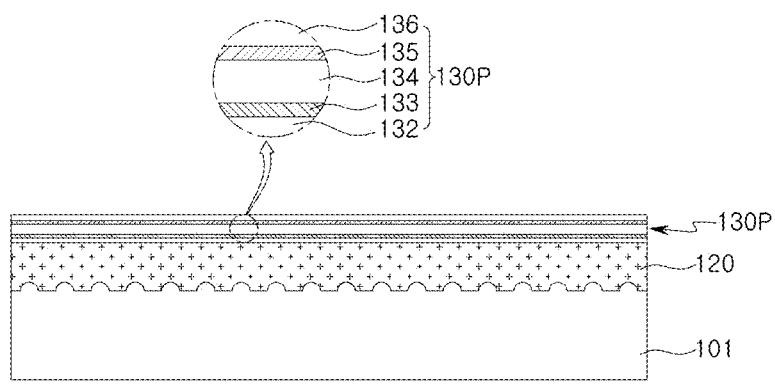

Referring to FIG. 5B, a preliminary mask layer 130P may be formed on the first conductivity-type semiconductor base layer 120.

The preliminary mask layer 130P may become a mask layer 130 as a plurality of openings H (refer to FIG. 1) are formed in a follow-up process. The preliminary mask layer 130P may include first to fifth layers 132 to 136, and the first to fifth layers 132 to 136 may be sequentially formed on the first conductivity-type semiconductor base layer 120.

The first, third, and fifth layers 132, 134, and 136, oxide layers or nitride layer, may be formed through chemical vapor deposition (CVD) or physical vapor deposition (PVD).

The second and fourth layers 133 and 135, graphene layers, may be formed as a graphene monolayer or multiple layers, and may be formed through various methods such as CVD, molecular beam epitaxy (MBE), mechanical exfoliation from graphite crystals, silicon carbide (SiC) crystal pyrolysis method, and the like. In addition, exfoliation of highly ordered pyrolytic graphite (HOPG), chemical reduction of graphite oxide flakes, thermal exfoliation, electrostatic deposition, liquid phase exfoliation of graphite, arc-discharging, a solvothermal method, and the like, may also be used.

The graphene layers may be at least partially oxidized according to an exemplary implementation. For example, after graphene is formed, a heat treatment may be performed on the graphene under an oxygen atmosphere at a temperature ranging from approximately 500° C. to 900° C. to oxidize at least a portion of the graphene.

Figure 5C:
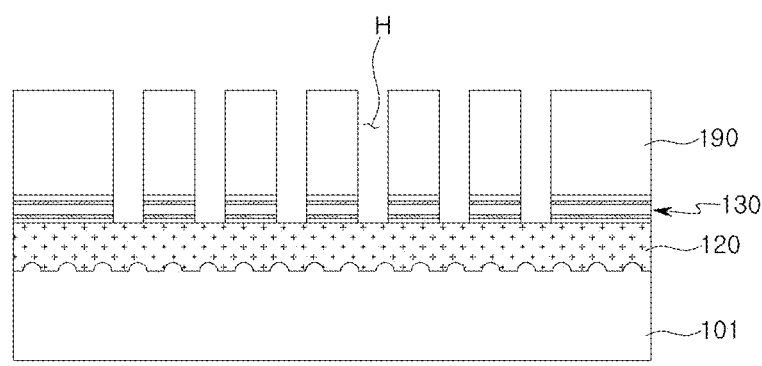

Referring to FIG. 5C, a mask layer 130 and a mold layer 190 may be formed, in which a plurality of openings H are formed.

First, a material for forming the mold layer 190 may be deposited on the preliminary mask layer 130P and patterned using an extra mask pattern to form the mask layer 130 and the mold layer 190. The mask layer 130 and the mold layer 190 may be formed of materials whose etching rates are different under particular etching conditions, and thus, an etching process may be controlled when the plurality of openings H are formed. In detail, the fifth layer 136 (refer to FIG. 5B), the uppermost layer, among the plurality of layers constituting the mask layer 130, and the mold layer 190 may be formed of different materials, and, for example, in a case in which the fifth layer 136 is a nitride layer, the mold layer 190 may be formed of a silicon oxide layer.

The sum of thicknesses of the mask layer 130 and the mold layer 190 may be designed in consideration of an intended height of the light emitting nanostructures 140 (refer to FIG. 1). Also, the size of the openings H may be designed in consideration of the size of the light emitting nanostructures 140.

Figure 5D:
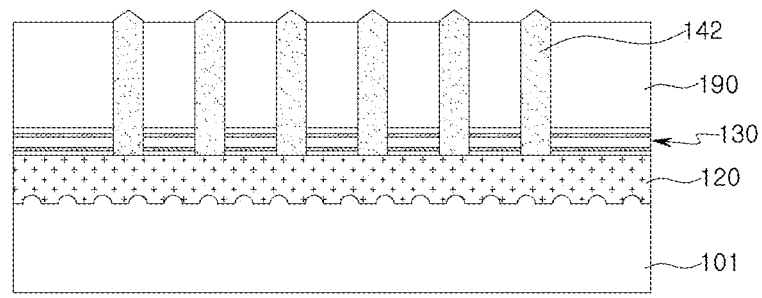

Referring to FIG. 5D, a first conductivity-type semiconductor may be grown on the exposed regions of the first conductivity-type semiconductor base layer 120 such that the plurality of openings H are filled, thus forming a plurality of first conductivity-type semiconductor cores 142.

The first conductivity-type semiconductor cores 142 may be formed of, for example, an n-type nitride semiconductor, and may be formed of a material identical to that of the first conductivity-type semiconductor base layer 120. The first conductivity-type semiconductor core 142 may be formed using metal-organic chemical vapor deposition (MOCVD) or molecular beam epitaxy (MBE).

In this stage or in a follow-up stage described with reference to FIG. 5E, a process may be performed at a high temperature of approximately 700° C. or higher, and thus, thicknesses of the first, third, and fifth layers 132, 134, and 136 constituting the mask layer 130 may be reduced and crystallinity of the mask layer 130 may be changed, which may result in a change in a coefficient of thermal expansion and stress. However, according to the present exemplary implementation, since the mask layer 130 includes the second and fourth layers 133 and 135 as graphene layers, stress may be alleviated and a path of a leakage current through grain boundaries of the first, third, and fifth layers 132, 134, and 136 may be blocked.

Figure 5E:
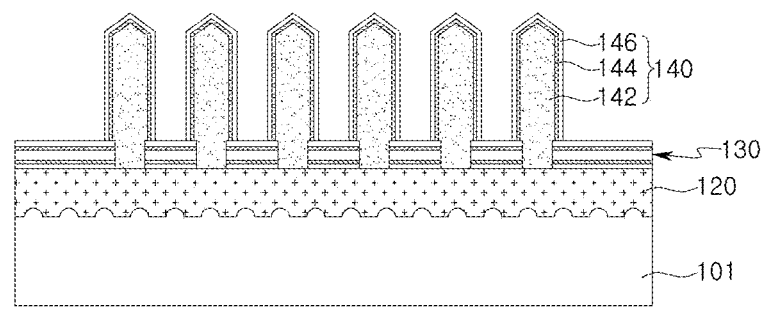

Referring to FIG. 5E, the mold layer 190 may be removed to expose the lateral surfaces of the plurality of first conductivity-type semiconductor cores 142, and an active layer 144 and a second conductivity-type semiconductor layer 146 may be formed.

First, the mold layer 190 may be selectively removed with respect to the mask layer 130 and the first conductivity-type semiconductor cores 142 to leave the mask layer 130. The removing of the mold layer 190 may be performed by a wet etching process, for example. The mask layer 130 may serve to prevent the active layer 144 and the second conductivity-type semiconductor layer 146 from being connected to the first conductivity-type semiconductor base layer 120 in a follow-up process.

After the mold layer 190 is removed, a heat-treatment process may be performed to convert crystal planes of the first conductivity-type semiconductor cores 142 into stable planes advantageous to crystal growth, such as semi-polar or non-polar crystal planes. Thus, a width of the first conductivity-type semiconductor cores 142 may be greater than that of the openings H, and crystallinity of the first conductivity-type semiconductor cores 142 may be increased through regrowth. However, this process may be omitted in consideration of the shape of the openings H and a growth shape of the first conductivity-type semiconductor cores 142 based on the shape of the openings H.

Thereafter, the active layer 144 and the second conductivity-type semiconductor layer 146 may be sequentially grown on surfaces of the first conductivity-type semiconductor cores 142. Accordingly, light emitting nanostructures 140 having a core-shell structure may be formed. As described above, the active layer 144 and the second conductivity-type semiconductor layer 146 formed on m planes and r planes of the first conductivity-type semiconductor cores 142 may have different thicknesses according to a deposition method.

Also, according to another exemplary implementation, an electric charge blocking layer may be formed on the active layer 144. In this case, the active layer 144 may not be disposed on a sloped surface of the upper end portion of each of the first conductivity-type semiconductor cores 142, and the electric charge blocking layer may be disposed instead. The electric charge blocking layer may serve to prevent electric charges injected from the first conductivity-type semiconductor core 142 from being transferred to the second conductivity-type semiconductor layer 146, rather than being used for electron-hole recombination in the active layer 144. The electric charge blocking layer may include a material having band gap energy greater than that of the active layer 144. For example, the electric charge blocking layer may include AlGaN or AlInGaN.

Figure 5F:
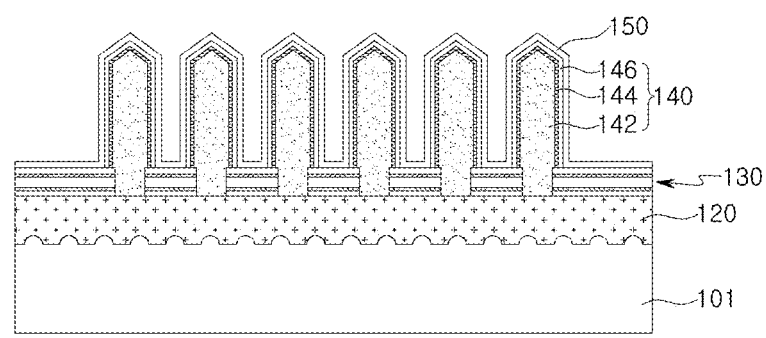

Referring to FIG. 5F, a transparent electrode layer 150 may be formed on the second conductivity-type semiconductor layer 146.

The transparent electrode layer 150 may extend to cover upper surfaces of the mask layer 130 between adjacent light emitting nanostructures 140 and may be formed as a single layer on the plurality of light emitting nanostructures 140.

Thereafter, referring to FIG. 5F together with FIG. 1, the filler layer 160 may be formed on the transparent electrode layer 150. According to another exemplary implementation, the filler layer 160 may be formed as a plurality of layers, and in this case, the plurality of layers may be formed of different materials, respectively, or when the plurality of layers are formed of the same material, the layers may be formed through different deposition processes. Thereafter, a region of the first conductivity-type semiconductor base layer 120 is exposed to form a first electrode 170, and a second electrode 180 may be formed on the transparent electrode layer 150.

According to another exemplary implementation, instead of the transparent electrode layer 150, a reflective electrode layer may be formed, and the reflective electrode layer may include silver (Ag) or aluminum (Al). In this case, the semiconductor light emitting device 101 may be flipchip mounted on an external device such as a package board.

Figure 6A:
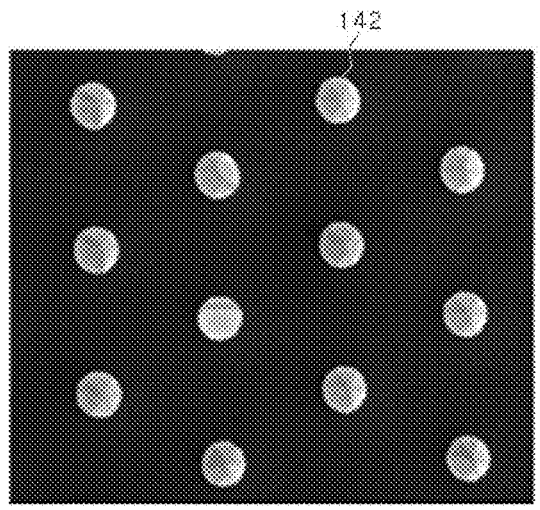
FIGS. 6A and 6B are microscopic images of a first conductivity-type semiconductor core based on a method for manufacturing a semiconductor light emitting device according to an exemplary implementation of the present disclosure.
Figure 6B:
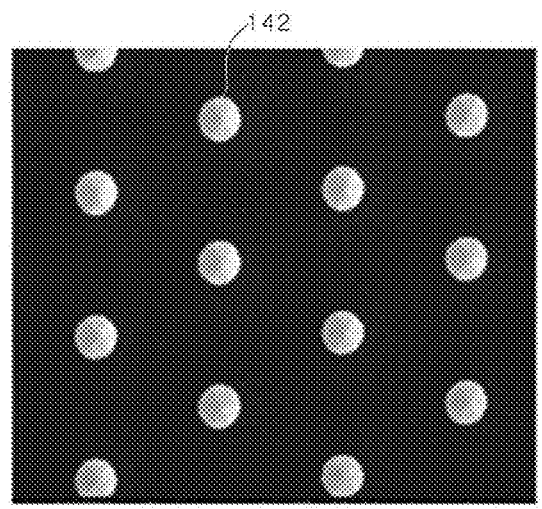

FIGS. 6A and 6B are microscopic images of a first conductivity-type semiconductor core based on a method for manufacturing a semiconductor light emitting device according to an exemplary implementation of the present disclosure. FIGS. 6A and 6B illustrate results obtained by analyzing the first conductivity-type semiconductor cores 142 from the above by a scanning electron microscopy (SEM).

Referring to FIGS. 6A and 6B, a shape of the first conductivity-type semiconductor cores 142 is shown, which have been described above with reference to FIG. 5D, after a growth process. As a mask layer, the mask layer 130 including the first and fifth layers 132 and 136 of SiN, the third layer 134 of $SiO_2$, and the second and fourth layers 133 and 135 as graphene monolayers was used. As illustrated, even in the case of using the mask layer 130 composed of five layers, the first conductivity-type semiconductor cores 142 was stably grown.

In the case of FIG. 6A, the thickness of the first layer 132 was approximately 30 nm, that of the third layer 134 was approximately 100 nm, and that of the fifth layer 136 was approximately 70 nm. In the case of FIG. 6B, the thickness of the first layer 132 was approximately 70 nm, that of the third layer 134 was approximately 100 nm, and that of the fifth layer 136 was approximately 30 nm.

In the semiconductor light emitting device manufacturing using the mask layer 130 as described above, a leakage current was reduced from approximately 214 μA to approximately 8 μA, compared to the case of using a mask layer as a SiN monolayer, and a light output was increased from approximately 23 mW to 42 mW or greater.

Figure 7:
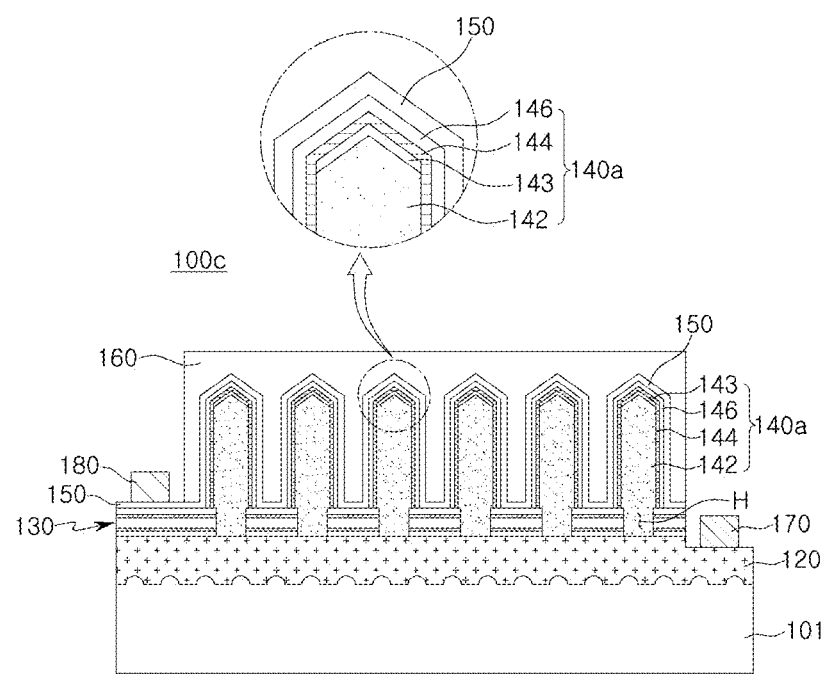
FIG. 7 is a cross-sectional view schematically illustrating a semiconductor light emitting device according to another exemplary implementation of the present disclosure.

FIG. 7 is a cross-sectional view schematically illustrating a semiconductor light emitting device according to another exemplary implementation of the present disclosure.

Referring to FIG. 7, a semiconductor light emitting device 100c includes a substrate 101, and a first conductivity-type semiconductor base layer 120, a mask layer 130, light emitting nanostructures 140a, a transparent electrode layer 150, and a filler layer 160 formed on the substrate 101. Each light emitting nanostructure 140a includes a first conductivity-type semiconductor core 142, a high resistive layer 143, an active layer 144, and a second conductivity-type semiconductor layer 146 grown on the first conductivity-type semiconductor base layer 120. The semiconductor light emitting device 100c may further include first and second electrodes 170 and 180 electrically connected to the first conductivity-type semiconductor base layer 120 and the second conductivity-type semiconductor layer 146, respectively.

In the present exemplary implementation, a high resistive layer 143 may be disposed on a sloped surface at the upper end portion of the first conductivity-type semiconductor core 142. However, according to another exemplary implementation, the high resistive layer 143 may be disposed on the active layer 144.

The high resistive layer 143 may be formed of a material having high electrical resistance to block a leakage current that may be generated in the upper end portion of the first conductivity-type semiconductor core 142. For example, the high resistive layer 143 may be formed of an undoped semiconductor or a semiconductor doped with an impurity having a conductivity type opposite to that of the first conductivity-type semiconductor core 142. For example, in a case in which the first conductivity-type semiconductor core 142 is an n-type GaN, the high resistive layer 143 may be undoped GaN or GaN doped with a p-type impurity such as magnesium (Mg). However, the high resistive layer 143 may be various compositions according to exemplary implementations, and may be formed as a layer formed of $Al_xIn_yGa_{1-x-y}N$ ($0 \leq x<1$, $0 \leq y<1$, $0 \leq x+y<1$) by additionally supplying at least one of sources among aluminum (Al) and indium (In) as in-situ after the first conductivity-type semiconductor core 142 is grown.

In the present exemplary implementation, since the semiconductor light emitting device 100c includes the mask layer 130 and the high resistive layer 143 including a heterogeneous interface, a leakage current may be effectively blocked in both the upper and lower portions of the light emitting nanostructures 140a.

Figure 8:
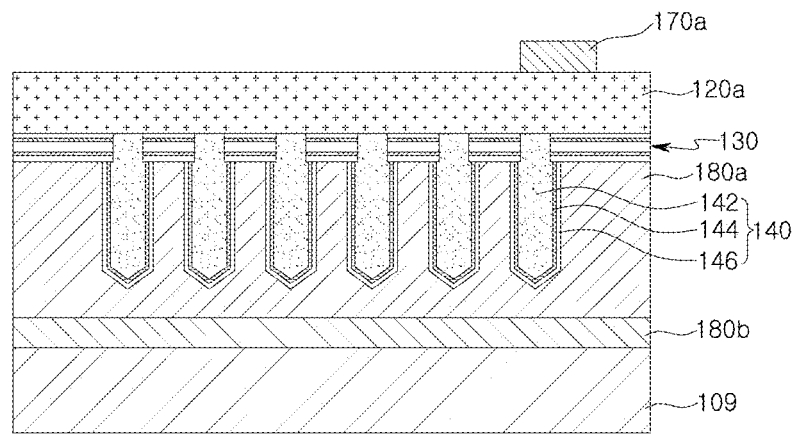
FIG. 8 is a cross-sectional view schematically illustrating a semiconductor light emitting device according to another exemplary implementation of the present disclosure.

FIG. 8 is a cross-sectional view schematically illustrating a semiconductor light emitting device according to another exemplary implementation of the present disclosure.

Referring to FIG. 8, a semiconductor light emitting device 100d includes a conductive substrate 109, a first conductivity-type semiconductor base layer 120a, a mask layer 130, and light emitting nanostructures 140. Each light emitting nanostructure 140 includes a first conductivity-type semiconductor core 142 grown on the first conductivity-type semiconductor base layer 120a, an active layer 144, and a second conductivity-type semiconductor layer 146. The semiconductor light emitting device 100d may further include a first electrode 170a and second electrodes 180a and 180b electrically connected to the first conductivity-type semiconductor 120a and the second conductivity-type semiconductor layer 146, respectively.

The conductive substrate 109 may be formed of a conductive material and may be, for example, a silicon (Si) substrate or a Si—Al alloy substrate.

The second electrodes 180a and 180b may include a contact electrode layer 180a and a bonding electrode layer 180b, and the conductive substrate 109 may be electrically connected to the contact electrode layer 180a by the bonding electrode layer 180b. According to another exemplary implementation, a transparent electrode 150 may further be disposed to cover the light emitting nanostructures 140 as illustrated in FIG. 1.

The contact electrode layer 180a may include a material appropriate for realizing ohmic-contact with the second conductivity-type semiconductor layer 146 of the light emitting nanostructures 140. The contact electrode layer 180a may be formed of, for example, GaN, InGaN, ZnO, or a graphene layer. Also, the contact electrode layer 180a may include a material such as Ag, Ni, Al, Rh, Pd, Ir, Ru, Mg, Zn, Pt, Au, or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like. In particular, the contact electrode layer 180a may be formed as a reflective metal layer in consideration of light extraction efficiency. In this case, the contact electrode layer 180a may upwardly reflect light emitted from the active layer 144 and traveling toward the substrate 109. The bonding electrode layer 180b may be, for example, a eutectic metal layer such as Ni/Sn.

The semiconductor light emitting device 100d according to the present exemplary implementation may be manufactured by a process of forming the contact electrode layer 180a, instead of the filler layer 160, and forming the bonding electrode layer 180b on the contact electrode layer 180a during the process as described above with reference to FIG. 5F. Thereafter, the conductive substrate 109 is bonded to the contact electrode layer 180a, and the substrate 101 (refer to FIG. 1), a growth substrate of semiconductor layers, on the first conductivity-type semiconductor 120a, may be removed. The first conductivity-type semiconductor base layer 120a according to the present exemplary implementation may not have a depression and protrusion pattern such as that of the semiconductor light emitting device 100 of FIG. 1, but the present disclosure is not limited thereto.

Figure 9:
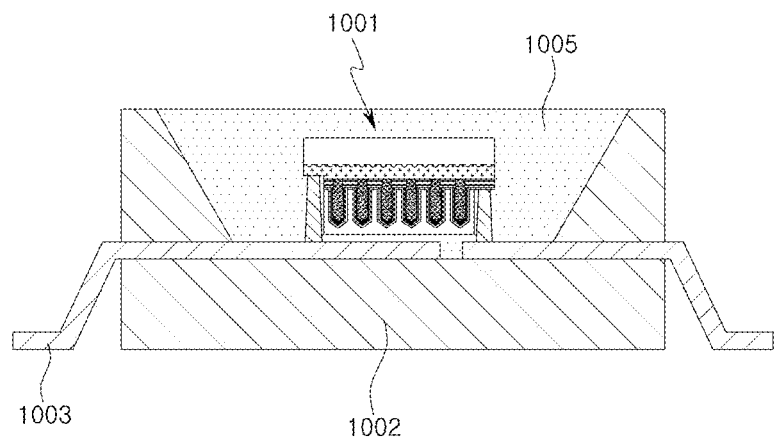
FIGS. 9 and 10 are views illustrating examples of packages employing a semiconductor light emitting device according to an exemplary implementation of the present disclosure.
Figure 10:
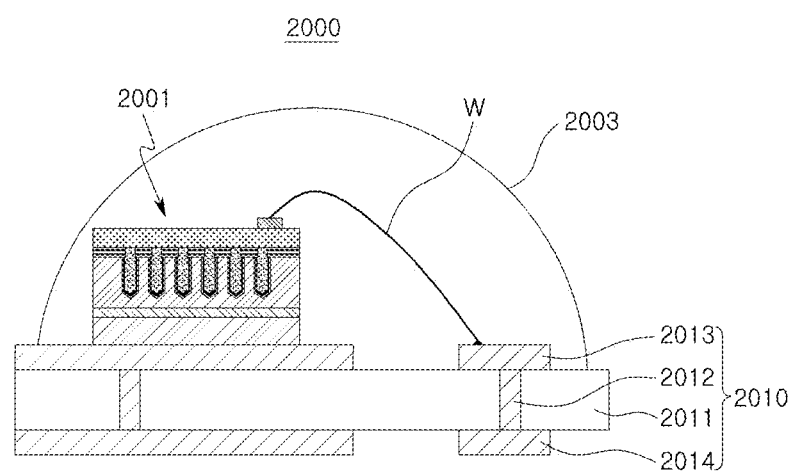

FIGS. 9 and 10 are views illustrating examples of packages employing a semiconductor light emitting device according to an exemplary implementation of the present disclosure.

Referring to FIG. 9, a semiconductor light emitting device package 1000 may include a semiconductor light emitting device 1001, a package body 1002, and a pair of lead frames 1003. The semiconductor light emitting device 1001 may be mounted on the lead frame 1003 and electrically connected to the lead frame 1003 through a wire W. According to an exemplary implementation, the semiconductor light emitting device 1001 may be mounted on a different region, for example, on the package body 1002, rather than on the lead frame 1003. The package body 1002 may have a cup shape to improve reflectivity efficiency of light. An encapsulant 1005 formed of a light-transmissive material may be formed in the reflective cup to encapsulate the semiconductor light emitting device 1001.

In the present exemplary implementation, the semiconductor light emitting device package 1000 is illustrated as including the semiconductor light emitting device 1001 having a structure similar to that of the semiconductor light emitting device 100 illustrated in FIG. 1. In detail, the semiconductor light emitting device 100 of FIG. 1 is mounted in a flipchip structure in which both the first and second electrodes 170 and 180 are disposed downwardly toward a mounting board 2010, and in this case, the filter layer 160 may be formed of a conductive material. However, according to an exemplary implementation, the semiconductor light emitting device package 1000 may include the semiconductor light emitting device 100 of FIG. 1 mounted such that the first and second electrodes 170 and 180 face upwards, and may also include the semiconductor light emitting devices 100a, 100b, 100c, and 100d according to the other exemplary implementations as described above with reference to FIGS. 3, 4, 7, and 8.

Referring to FIG. 10, a semiconductor light emitting device package 2000 may include a semiconductor light emitting device 2001, a mounting board 2010, and an encapsulant 2003. The semiconductor light emitting device 2001 may be mounted on the mounting board 2010 and electrically connected to the mounting board 2010 through a wire W and the conductive substrate 109 (refer to FIG. 8).

The mounting board 2010 may include a board body 2011, an upper electrode 2013, and a lower electrode 2014. Also, the mounting board 2010 may include a through electrode 2012 connecting the upper electrode 2013 and the lower electrode 2014. The mounting board 2010 may be provided as a board such as PCB, MCPCB, MPCB, FPCB, or the like, and the structure of the mounting board 2010 may be applied to have various forms.

The encapsulant 2003 may be formed to have a lens structure with an upper surface having a convex dome shape. However, according to an exemplary implementation, the encapsulant 2003 may have a lens structure having a convex or concave surface to adjust a beam angle of light emitted through an upper surface of the encapsulant 2003.

In the present exemplary implementation, the semiconductor light emitting device package 2000 is illustrated as including the semiconductor light emitting device 2001 having a structure identical to that of the semiconductor light emitting device 100d illustrated in FIG. 8, but it may also include the semiconductor light emitting devices 100, 100a, 100b, and 100c according to the other exemplary implementations of the present disclosure described above with reference to FIGS. 1, 3, 4, and 7.

Figure 11:
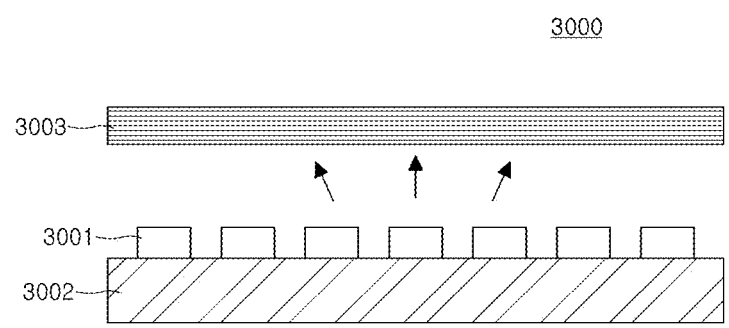
FIGS. 11 and 12 are examples of backlight units employing a semiconductor light emitting device according to an exemplary implementation of the present disclosure.
Figure 12:
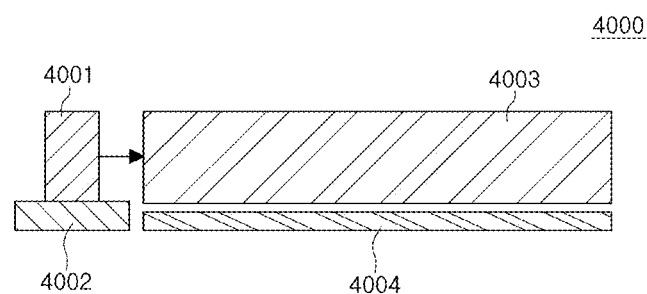

FIGS. 11 and 12 are examples of backlight units employing a semiconductor light emitting device according to an exemplary implementation of the present disclosure.

Referring to FIG. 11, a backlight unit 3000 includes light sources 3001 mounted on a substrate 3002 and one or more optical sheets 3003 disposed above the light sources 3001. The semiconductor light emitting device package having the structure described above with reference to FIGS. 9 and 10 or a structure similar thereto may be used as the light sources 3001. Alternatively, a semiconductor light emitting device may be directly mounted on the substrate 3002 (a so-called COB type) and used.

Unlike the backlight unit 3000 in FIG. 11 in which the light sources 3001 emit light toward an upper side where a liquid crystal display is disposed, a backlight unit 4000 as another example illustrated in FIG. 12 is configured such that a light source 4001 mounted on a substrate 4002 emits light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 13:
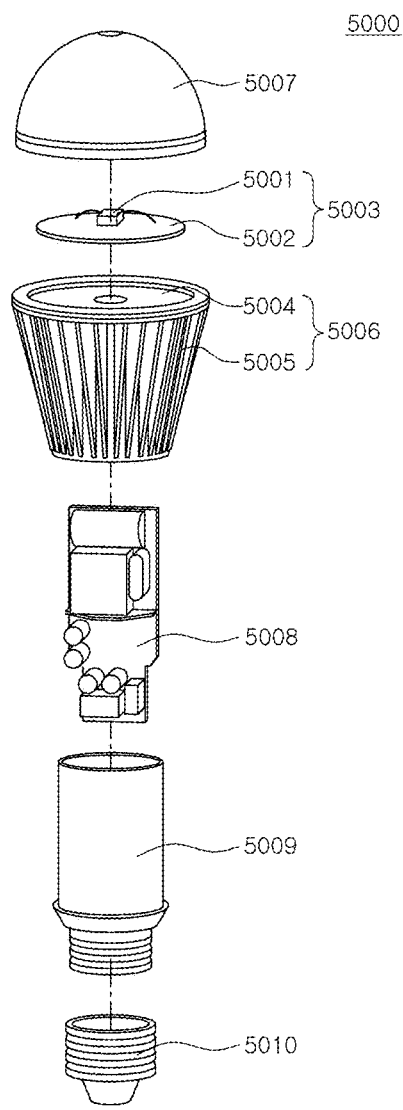
FIG. 13 is a view illustrating an example of a lighting device employing a semiconductor light emitting device according to an exemplary implementation of the present disclosure.

FIG. 13 is a view illustrating an example of a lighting device employing a semiconductor light emitting device according to an exemplary implementation of the present disclosure.

Referring to the exploded perspective view of FIG. 13, a lighting device 5000 is illustrated as, for example, a bulb-type lamp and includes a light emitting module 5003, a driving unit 5008, and an external connection unit 5010. Also, the lighting device 5000 may further include external structures such as external and internal housings 5006 and 5009 and a cover unit 5007. The light emitting module 5003 may include a semiconductor light emitting device 5001 having a structure identical or similar to those of the semiconductor light emitting devices 100, 100a, 100b, 100c, and 100d described above with reference to FIGS. 1, 3, 4, 7, and 8 and a circuit board 5002 on which the semiconductor light emitting device 5001 is mounted. In the present exemplary implementation, it is illustrated that a single semiconductor light emitting device 5001 is mounted on the circuit board 5002, but a plurality of semiconductor light emitting devices may be installed as needed. Also, the semiconductor light emitting device 5001 may be manufactured as a package and subsequently mounted, rather than being directly mounted on the circuit board 5002.

The external housing 5006 may serve as a heat dissipation unit and may include a heat dissipation plate 5004 disposed to be in direct contact with the light emitting module 5003 to enhance heat dissipation and heat dissipation fins 5005 surrounding the lateral surfaces of the lighting device 5000. Also, the cover unit 5007 may be installed on the light emitting module 5003 and have a convex lens shape. The driving unit 5008 may be installed in the internal housing 5009 and connected to the external connection unit 5010 having a socket structure to receive power from an external power source. Also, the driving unit 5008 may serve to convert power into an appropriate current source for driving the semiconductor light emitting device 5001 of the light emitting module 5003, and provide the same. For example, the driving unit 5008 may be configured as an AC-DC converter, a rectifying circuit component, or the like.

Also, although not shown, the lighting device 5000 may further include a communications module.

Figure 14:
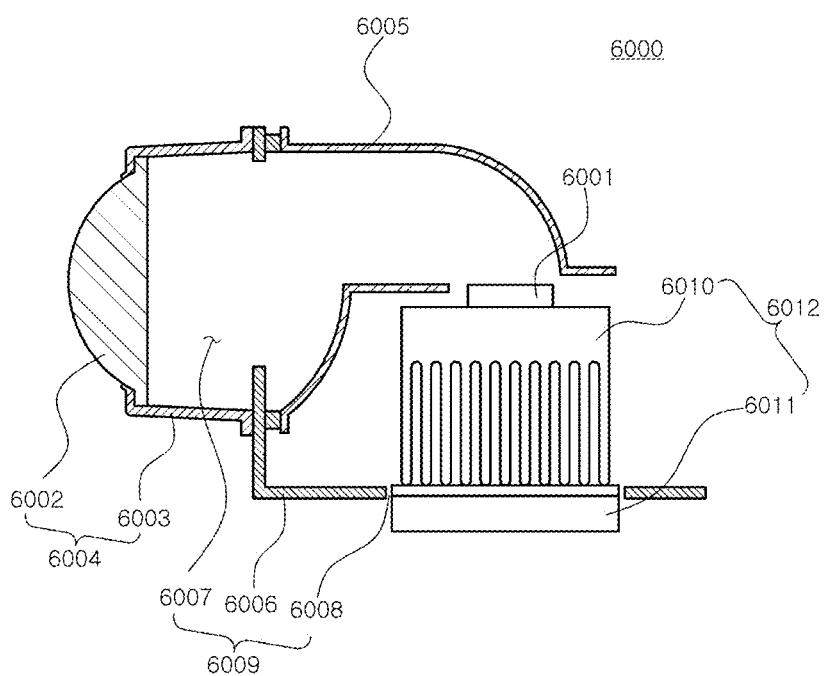
FIG. 14 is a view illustrating an example of a headlamp employing a semiconductor light emitting device according to an exemplary implementation of the present disclosure.

FIG. 14 is a view illustrating an example of a headlamp employing a semiconductor light emitting device according to an exemplary implementation of the present disclosure.

Referring to FIG. 14, a headlamp 6000 used as a vehicle lamp, or the like, may include a light source 6001, a reflective unit 6005, and a lens cover unit 6004. The lens cover unit 6004 may include a hollow guide 6003 and a lens 6002. The light source 6001 may include at least one of semiconductor light emitting device packages of FIGS. 9 and 10. The headlamp 6000 may further include a heat dissipation unit 6012 outwardly dissipating heat generated by the light source 6001. In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a body unit 6006 and a central hole 6008 formed in one surface thereof, in which the heat dissipation unit 6012 is coupled. Also, the housing 6009 may have a front hole 6007 formed in the other surface integrally connected to the one surface and bent in a right angle direction. The reflective unit 6005 is fixed to the housing 6009 such that light generated by the light source 6001 is reflected thereby to pass through the front hole 6007 to be output outwardly.

As set forth above, in the case of the semiconductor light emitting device according to exemplary implementations of the present disclosure, a mask is used to form light emitting nanostructures, and thus, a leakage current may be reduced and a light output may be increased.

Advantages and effects of the present disclosure are not limited to the foregoing content and any other technical effects not mentioned herein may be easily understood by a person skilled in the art from the foregoing description.

While exemplary implementations have been shown and described above, it will be apparent to those skilled in the art that modifications and variations could be made without departing from the spirit and scope of the present disclosure as defined by the appended claims.

What is claimed is:

1. A semiconductor light emitting device comprising:
a first conductivity-type semiconductor base layer;
a mask layer disposed on the first conductivity-type semiconductor base layer and including a graphene layer with a plurality of openings exposing the first conductivity-type semiconductor base layer; and
a plurality of light emitting nanostructures disposed on the openings and each including a first conductivity-type semiconductor core, an active layer, and a second conductivity-type semiconductor layer,
wherein the mask layer comprises first, second and third layers sequentially stacked on the first conductivity-type semiconductor base layer, and the second layer is the graphene layer, and each of the first and third layers is an oxide layer or a nitride layer.

2. The semiconductor light emitting device of claim 1, wherein a portion of the first and third layers is crystalline.

3. The semiconductor light emitting device of claim 1, wherein the oxide layer includes at least one of $SiO_2$, $Al_2O_3$, ZrO, and $TiO_2$, and the nitride layer includes at least one of SiN, SiON, TiN, TiAlN, TiSiN, and AlN.

4. The semiconductor light emitting device of claim 1, wherein the mask layer comprises a first nitride layer, a first graphene layer, an oxide layer, a second graphene layer, and a second nitride layer sequentially stacked on the first conductivity-type semiconductor base layer.

5. The semiconductor light emitting device of claim 4, wherein a thickness of the oxide layer is greater than thicknesses of the first and second nitride layers.

6. The semiconductor light emitting device of claim 1, wherein the graphene layer includes graphene in the form of a quantum dot.

7. The semiconductor light emitting device of claim 1, wherein the graphene layer is a monolayer graphene or a multilayer graphene.

8. The semiconductor light emitting device of claim 1, wherein a portion of the graphene layer is oxidized.

9. The semiconductor light emitting device of claim 1, wherein a thickness of the mask layer ranges from 160 nm to 240 nm.

10. The semiconductor light emitting device of claim 1, wherein the plurality of light emitting nanostructures further include a high resistive layer disposed to be in contact with the active layer.

11. The semiconductor light emitting device of claim 1, further comprising a transparent electrode layer positioned on the second conductivity-type semiconductor layer.

12. A semiconductor light emitting device comprising:
a first conductivity-type semiconductor base layer;
a mask layer disposed on the first conductivity-type semiconductor base layer and including two or more layers formed of different materials with a plurality of openings exposing the first conductivity-type semiconductor base layer; and
a plurality of light emitting nanostructures disposed on the openings and each including a first conductivity-type semiconductor core, an active layer, and a second conductivity-type semiconductor layer,
wherein the mask layer comprises first, second and third layers sequentially stacked on the first conductivity-type semiconductor base layer, and the second layer is the graphene layer, and each of the first and third layers is an oxide layer or a nitride layer.

13. The semiconductor light emitting device of claim 12, wherein the mask layer comprises at least two graphene layer.

14. A backlight unit comprising:
a substrate;
a light source mounted on the substrate; and
an optical sheet disposed above the light source,
wherein the light source includes the light emitting device of claim 12.

15. A semiconductor light emitting device comprising:
a first conductivity-type semiconductor base layer;
a mask layer disposed on the first conductivity-type semiconductor base layer and including an opening exposing the first conductivity-type semiconductor base layer; and
a light emitting nanostructure disposed on the opening and including a first conductivity-type semiconductor core, a high resistive layer, an active layer, and a second conductivity-type semiconductor layer sequentially stacked,
wherein the mask layer comprises first, second and third layers sequentially stacked on the first conductivity-type semiconductor base layer, and the second layer is the graphene layer, and each of the first and third layers is an oxide layer or a nitride layer.

16. The semiconductor light emitting device of claim 15, wherein the high resistive layer is deposed between the first conductivity-type semiconductor core and the active layer.

17. The semiconductor light emitting device of claim 15, wherein the high resistive layer is deposed on the active layer.

18. The semiconductor light emitting device of claim 15, wherein the high resistive layer is configured to block leakage current generated in an upper portion of the first conductivity-type semiconductor core.

* * * * *